United States Patent
Wu

(10) Patent No.: US 11,258,030 B2
(45) Date of Patent: Feb. 22, 2022

(54) ELECTRON TRANSPORT MATERIAL AND FORMATION METHOD AND QUANTUM DOT LIGHT EMITTING DIODE

(71) Applicant: TCL TECHNOLOGY GROUP CORPORATION, Huizhou (CN)

(72) Inventor: Longjia Wu, Huizhou (CN)

(73) Assignee: TCL TECHNOLOGY GROUP CORPORATION, Huizhou (CN)

(*) Notice: Subject to any disclaimer, the term of this patent is extended or adjusted under 35 U.S.C. 154(b) by 122 days.

(21) Appl. No.: 16/910,795

(22) Filed: Jun. 24, 2020

(65) Prior Publication Data
US 2020/0321548 A1   Oct. 8, 2020

Related U.S. Application Data

(63) Continuation of application No. PCT/CN2018/121252, filed on Dec. 14, 2018.

(30) Foreign Application Priority Data

Dec. 28, 2017 (CN) .......................... 201711464310.9

(51) Int. Cl.
*H01L 51/50* (2006.01)
*H01L 51/56* (2006.01)

(52) U.S. Cl.
CPC ........ *H01L 51/5076* (2013.01); *H01L 51/502* (2013.01); *H01L 51/56* (2013.01); *H01L 2251/303* (2013.01)

(58) Field of Classification Search
CPC .................. H01L 51/5076; H01L 2251/303
See application file for complete search history.

(56) References Cited

U.S. PATENT DOCUMENTS

2014/0070178 A1   3/2014   Lee et al.

FOREIGN PATENT DOCUMENTS

| CN | 101660120 A | 3/2010 |
| CN | 106410051 A | 2/2017 |

OTHER PUBLICATIONS

World Intellectual Property Organization (WIPO) International Search Report for PCT/CN2018/121252 dated Mar. 14, 2019 5 Pages.

*Primary Examiner* — Anthony Ho
(74) *Attorney, Agent, or Firm* — Anova Law Group, PLLC

(57) ABSTRACT

An electron transport material includes zinc oxide (ZnO) doped with metal ions. The metal ions are two or three metal ions of different valences of a same metal element. A lowest valence state of the metal ions is positive divalent.

20 Claims, 1 Drawing Sheet

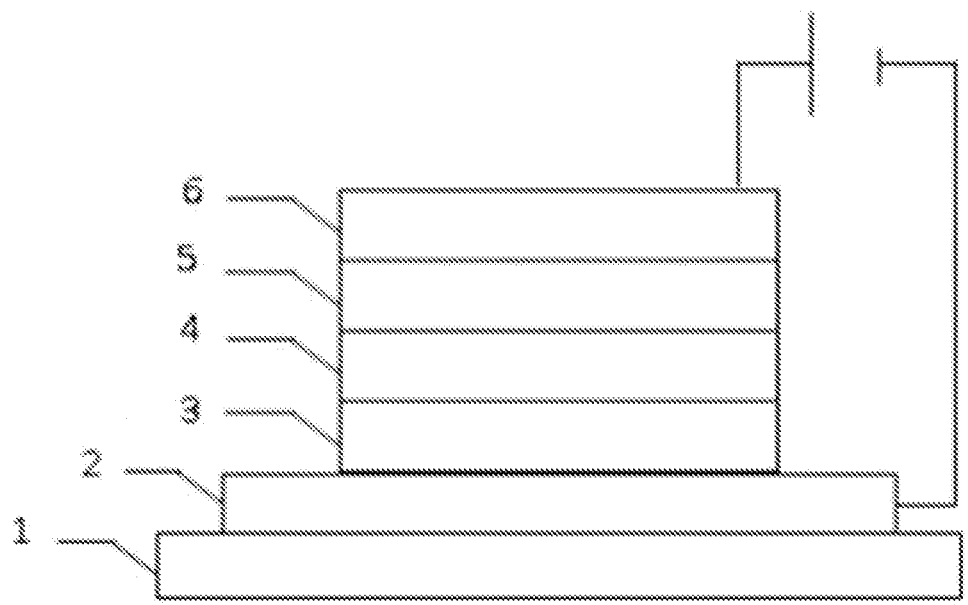

ELECTRON TRANSPORT MATERIAL AND FORMATION METHOD AND QUANTUM DOT LIGHT EMITTING DIODE

This application is a continuation of International Application No. PCT/CN2018/121252, filed on Dec. 14, 2018, which claims priority to Chinese Application No. 201711464310.9, filed on Dec. 28, 2017, the entire contents of both of which are incorporated herein by reference.

TECHNICAL FIELD

The present disclosure relates to the material technology field and, more particularly, to an electron transport material, a preparation method thereof, and a quantum dot light-emitting diode (QLED).

BACKGROUND

With display technology continues to progress, quantum dot light-emitting diodes (QLED) using a quantum dot (QD) material as a light-emitting layer attract more and more attention. The properties of the QD materials include high luminous efficiency, controllable luminescent color, high color purity, good device stability, usability in flexible displays, etc. These properties of QLED make it very a very attractive choice in the fields of display technology and solid-state lighting.

Zinc oxide (ZnO) is used as an electron transport layer (ETL) material, which is commonly used in the QLED. ZnO has a good energy level match with the cathode and the QD light-emitting layer, which can significantly reduce an electron injection barrier from the cathode to the QD light-emitting layer. ZnO also has a deeper valence band energy level, which can effectively block a hole. Furthermore, the ZnO material has a good electron transport capability with electron mobility up to $10^{-3}$ $cm^2/V \cdot s$. These properties make the ZnO material a most often selected material for the ETL of a QLED device, which can significantly improve stability and luminous efficiency of the device.

To further improve the performance of the QLED device, metal-ion-doped ZnO ETL is widely used. The method can adjust a forbidden bandwidth of the ZnO ETL to a certain width, which can optimize conductivity and energy level structure of the ZnO ETL. As such, the metal-ion-doped ZnO ETL improves the luminous efficiency of the QLED device. For example, doping the ZnO material with high valent metal ions, such as $Al^{3+}$, $Ga^{3+}$, etc., can increase a free carrier density of the ZnO material and obtain an excellent conductivity property. To further improve the conductivity of the ZnO material, the amount of dopant is necessary to be increased. However, since a large ion radius difference between the commonly used high-valent metal ions and $Zn^{2+}$, solid solubility of the high-valent metal ions is greatly limited in the ZnO. Thus, the electrical conductivity of the ZnO material is hard to be further improved. Therefore, existing technology needs to be improved and developed.

SUMMARY

One aspect of the present disclosure provides an electron transport material including zinc oxide (ZnO) doped with metal ions. The metal ions are two or three metal ions of different valences of a same metal element. A lowest valence state of the metal ions is positive divalent.

Another aspect of the present disclosure provides a preparation method of an electron transport material. The method includes providing a zinc salt and a divalent doping metal salt, dissolving the zinc salt and the divalent doping metal salt in a first solvent to obtain a divalent-metal-ion-doped ZnO nanoparticle in an alkali condition, dispersing the divalent-metal-ion-doped ZnO nanoparticles in a second solvent to obtain a divalent-metal-ion-doped ZnO colloid solution, depositing the divalent-metal-ion-doped ZnO colloid solution on a substrate, and performing an oxidation treatment to obtain the electron transport material doped with metal ions. The metal ions are two or three metal ions of different valences of a same metal element. A lowest valence state of the metal ions is positive divalent.

Another aspect of the present disclosure provides a quantum dot light-emitting diode (QLED) including an anode, a cathode, and a quantum dot light-emitting layer. The quantum dot light-emitting layer is arranged between the anode and the cathode. An electron transport layer is arranged between the cathode and the quantum dot light-emitting layer. The electron transport layer includes zinc oxide (ZnO) doped with metal ions. The metal ions are two or three metal ions of different valences of a same metal element. A lowest valence state of the metal ions is positive divalent.

Another aspect of the present disclosure provides a preparation method of a quantum dot light-emitting diode (QLED), including providing a substrate. The substrate is arranged with a cathode. The QLED is an inverted QLED. The QLED includes an electron transport layer. A preparation method of the electron transport layer includes providing a zinc salt and a divalent doping metal salt, dissolving the zinc salt and the divalent doping metal salt in a first solvent to obtain a divalent-metal-ion-doped ZnO nanoparticle in an alkali condition, dispersing the divalent-metal-ion-doped ZnO nanoparticles in a second solvent to obtain a divalent-metal-ion-doped ZnO colloid solution, depositing the divalent-metal-ion-doped ZnO colloid solution on a substrate, and performing an oxidation treatment to obtain the electron transport material doped with metal ions. The metal ions are two or three metal ions of different valences of a same metal element. A lowest valence state of the metal ions is positive divalent.

BRIEF DESCRIPTION OF THE DRAWINGS

FIG. 1 illustrates a schematic structural diagram of a quantum dot light-emitting diode (QLED) according to some embodiments of the present disclosure.

DETAILED DESCRIPTION OF THE EMBODIMENTS

To clearly describe the technical problems, technical solutions, and beneficial effects of the present disclosure, the present disclosure is described further in detail below in connection with the accompanying drawings and embodiments. Specific embodiments described herein are merely intended to describe the present disclosure and are not intended to limit the present disclosure.

In one aspect, embodiments of the present disclosure provide an electron transport material. The electron transport material includes a metal-ion-doped ZnO. The metal ions are two or three metal ions of different valence states of a same metal element, and the metal ions have a lowest valence state of positive divalent.

Embodiments of the present disclosure provide an electron transport material. The ZnO material is co-doped with ions of the high and low valences of a same metal element. A doped ZnO material with the presence of low-valent metal ions (divalent metal ions) significantly improves the doping limit of high-valent metal ions in the ZnO material. Therefore, the conductivity of the ZnO electron transport material is significantly improved, which ultimately improves the luminous efficiency of the QLED device. The divalent doped metal ions used in some embodiments of the present disclosure may be widely selected. For example, the divalent metal ions that meet two conditions, such as easy oxidation and an ion radius close to an ion radius of a zinc ion. Therefore, the metal ions may be selected according to specific requirements of the electron transport material in practical application and may have strong applicability and practicality.

The ZnO is a semiconductor material with a wurtzite structure. In the structure of the ZnO, the zinc ion is located in the center of the tetrahedron composed of oxygen ions. Each zinc ion is surrounded by four oxygen ions, which form a cation with a coordination number of four. For the ZnO material, the high-valent metal ions ($Al^{3+}$, $Ga^{3+}$, etc.) are doped into the ZnO with the wurtzite structure and substitute the $Zn^{2+}$ sites. Therefore, the process generates free electrons, which increases the density of the electrons. As such, the increased density of the electrons increases the conductivity of the ZnO material. Theoretically, the greater the doping number of high-valence ions is, the higher the conductivity of the ZnO material is. Each kind of dopant ions has a doping limit of a host material. When the doping amount exceeds the doping limit, over doped ions are precipitated from the host material in a form of a second phase, which has an unpredictable effect on the performance of the host material. One of the main factors to determine the doping limit is a difference between the ion radius of the host ion and the ion radius of the doped ion. The greater the difference in the ion radiuses between the two ions is, the more severe the lattice distortion caused by ion doping is. Therefore, dynamic instability caused by the lattice distortion causes the doped ions to tend to precipitate from the host material. Since ion radiuses of high-valence doping ions ($Al^{3+}$, $Ga^{3+}$, etc.) commonly used in industry are much smaller than the ion radius of the zinc ion (as shown in TABLE 1 below), the difference exceeds 20% of the ion radius of the zinc ion. Therefore, the solid solubility of these high-valent ions in the ZnO material is greatly limited.

TABLE 1

|  | Zn2+ | Al3+ | Ga3+ | Mn4+ | Mn2+ |  |
| --- | --- | --- | --- | --- | --- | --- |
| Ion radius (Å) | 0.6 | 0.39 | 0.46 | 0.4 | 0.68 |  |
|  | Fe3+ | Fe2+ | Cr4+ | Cr2+ | Co4+ | Co2+ |
| Ion radius (Å) | 0.49 | 0.64 | 0.41 | 0.71 | 0.40 | 0.67 |

To solve the problem of the low solid solubility of the high-valent ions in the ZnO material, embodiments of the present disclosure select some specific divalent metal ions (such as $Fe^{2+}$, $Mn^{2+}$, $Cr^{2+}$, $Co^{2+}$, etc.) as a dopant for ZnO doping. These divalent metal ions have two properties. In one aspect, the ion radius of these ions is very close to the ion radius of $Zn^{2+}$ and is slightly larger than the ion radius of $Zn^{2+}$, which may be doped into the ZnO material in a large amount without precipitation. In another aspect, these metal ions are easy to be oxidized. In an oxygen environment, these metal ions only need a relatively low temperature to be oxidized to a higher valence state. By taking advantage of these two characteristics, embodiments of the present disclosure oxidize the ZnO electron transport material doped with a large amount of the specific divalent metal ions to make the portion of the divalent metal ions to a higher valence state. As such, the ZnO electron transport material co-doped with ions of the same metal element at different valence states is formed. Although the ion radius of the high-valency metal-doping ion formed after the oxidation treatment is still much smaller than the ion radius of the zinc ion, the lattice distortion is relieved to a certain extent due to existence of the low-valent co-doping ion of the same metal element. Thus, the doping limit of the high-valent doped metal ions is further increased in the ZnO. Therefore, by adjusting the doping percentage of the divalent metal ion and the parameters of the oxidation treatment, the doping ratio of the high-valence metal ion in the ZnO material can be significantly increased. As such, the ZnO electron transport material with higher conductivity can be obtained.

Embodiments of the present disclosure can oxidize some of the divalent doped metal ions to higher valence metal ions by doping the divalent metal ions into ZnO nanoparticles by using a heating oxidation treatment. In some embodiments, the electron transport material includes $Fe^{3+}$ and $Fe^{3+}$ co-doped ZnO, or the electron transport material includes $Mn^{4+}$ and $Mn^{4+}$ co-doped ZnO, or the electron transport material includes $Co^{4+}$ and $Co^{2+}$ co-doped ZnO, or the electron transport material includes $Cr^{4+}$ and $Cr^{2+}$ co-doped ZnO. Under a certain condition, the oxidation of the divalent metal ions is incomplete, which may produce intermediate divalent metal ions. For example, when the electron transport material is ZnO including co-doped $Mn^{4+}$ and $Mn^{2+}$, and further including a small amount of doped $Mn^{3+}$, that is, the electron transport material is $Mn^{4+}$, $Mn^{2+}$, and $Mn^{3+}$ co-doped ZnO. When the electron transport material is ZnO including co-doped $Co^{4+}$ and $Co^{2+}$, and further including a small amount of doped $Co^{3+}$, that is, the electron transport material is $Cr^{4+}$, $Cr^{2+}$ and $Cr^{3+}$ co-doped ZnO. When the electron transport material is ZnO including co-doped $Cr^{4+}$ and $Cr^{2+}$, and further including a small amount of doped $Cr^{3+}$, that is, the electron transport material is $Cr^{4+}$, $Cr^{2+}$, and $Cr^{3+}$ co-doped ZnO.

Further, when the electron transfer material according to the present disclosure includes the $Fe^{3+}$ and $Fe^{2+}$ co-doped ZnO, a molar ratio of $Fe^{3+}$ and $Fe^{2+}$ may be 20:1 to 1:1. In some embodiments, the molar ratio of $Fe^{3+}$ and $Fe^{2+}$ may also be 10:1 to 1:1, 4:1 to 5:4, or 9:5 to 3:2.

When the electron transfer material according to the present disclosure includes the $Cr^{4+}$ and $Cr^{2+}$ co-doped ZnO, a molar ratio of $Cr^{4+}$ and $Cr^{2+}$ may be 20:1 to 1:2. In some embodiments, the molar ratio of $Cr^{4+}$ and $Cr^{2+}$ may also be 10:1 to 1:2, 3:1 to 2:3, or 3:2 to 2:3.

When the electron transfer material according to the present disclosure includes the $Mn^{4+}$ and $Mn^{2+}$ co-doped ZnO, a molar ratio of $Mn^{4+}$ and $Mn^{2+}$ may be 10:1 to 2:3. In some embodiments, the molar ratio of $Mn^{4+}$ and $Mn^{2+}$ may also be 5:1 to 2:3, 2:1 to 1:1, or 3:2 to 1:1.

When the electron transfer material according to the present disclosure includes the $Co^{4+}$ and $Co^{2+}$ co-doped ZnO, a molar ratio of $Co^{4+}$ and $Co^{2+}$ may be 10:1 to 2:3. In some embodiments, the molar ratio of $Co^{4+}$ and $Co^{2+}$ may also be 5:1 to 2:3, 2:1 to 1:1, or 3:2 to 1:1.

Correspondingly, embodiments of the present disclosure provide a preparation method of the electron transport material, which includes the following processes.

At S01, zinc salt and divalent doping metal salt are provided. The zinc salt and the divalent doping metal salt are dissolved in a first solvent to obtain a divalent-metal-ion-doped ZnO nanoparticle solution under an alkaline condition.

At S02, the solvent and unreacted impurities are removed in the divalent-metal-ion-doped ZnO nanoparticle solution to obtain the ZnO nanoparticles doped with the divalent metal ions.

At S03, the ZnO nanoparticles doped with divalent metal ions are dissolved into a second solvent to obtain the divalent-metal-ion-doped ZnO colloid solution.

At S04, the divalent-metal-ion-doped ZnO colloid solution is deposited on a substrate, and the oxidization process is performed to obtain the electron transport material.

Embodiments of the present disclosure provide the preparation method for the electron transport material. The ZnO material is doped with partially oxidized divalent metal ions and is prepared as the electron transport material. The electron transport material is oxidized to obtain an electron transport material with different valence ions of the same metal element co-doped ZnO. This preparation method significantly increases the solid solubility limit of the high-valent metal ions in the ZnO material and further optimizes the conductivity of the ZnO electron transport material. As such, the luminous efficiency and the device performance of the QLED device are improved. In the preparation method, only one kind of metal ions needs to be doped to simultaneously realize the two functions of increasing the doping limit of the high-valence metal ions in the ZnO material and improving the conductivity of the ZnO electron transport material. Thus, the synthesis cost of the doped ZnO nanocolloid solution is significantly saved. In addition, the oxidation treatment used in embodiments of the present disclosure is very simple, has a low cost, is easy to operate, has a low requirement on the equipment, and has good repeatability. The preparation method can be performed at room temperature. The preparation method is a low-temperature solution method, which may be one of a low-temperature alcoholysis method, a low-temperature hydrolysis method, etc.

Further, at S01, the zinc salt is selected from at least one of zinc acetate ($ZnC_4H_6O_4$), zinc nitrate ($Zn(NO_3)_2$), zinc sulfate ($ZnSO_4$), zinc chloride ($ZnCl_2$), various hydrates of the above zinc salts, etc.

The divalent doping metal salt is selected from at least one of divalent iron salt, divalent manganese salt, divalent chromium salt, or divalent cobalt salt. Specifically, the divalent metal salt includes but is not limited to $FeSO_4$, $FeCl_2$, $MnSO_4$, $MnCl_2$, $Mn(CH_3COO)_2$, $Mn(NO_3)_2$, $Co(NO_3)_2$, $Co(CH_3COO)_2$, $CoSO_4$, $CoCl_2$, $CrCl_2$, and various hydrates of the above metal salts, etc.

The first solvent and the second solvent are individually selected from at least one of water, methanol, ethanol, propanol, butanol, ethylene glycol, ethylene glycol monomethyl ether, or dimethyl sulfoxide (DMSO).

The zinc salt and the divalent doping metal salt are provided. The zinc salt and the divalent doping metal salt are dissolved in the first solvent to obtain the divalent-metal-ion-doped ZnO nanoparticle solution under the alkaline condition. The zinc salt and the selected divalent metal salt are dissolved in a solvent at a certain ratio at room temperature. At the same time, the reaction alkali is also dissolved or diluted in another portion of the same or different solvent at room temperature to obtain an alkali solution. Hydroxide intermediates are generated by the reaction by adding the alkali solution to a mixture solution of the zinc salts and the divalent metal salts. Subsequently, the hydroxide intermediates undergo a condensation reaction to gradually generate the ZnO nanoparticles doped with the divalent metal ions. The temperature of the reaction by adding the alkali solution is 0-70° C. The duration of the reaction by adding the alkali solution is 0.5-4 h. In some embodiments, the temperature of the mixture solution of the salts is first adjusted to 0-70° C. The temperature of the reaction is selected in the range of 0-70° C. to ensure the formation of the doped ZnO nanoparticles and obtain a good particle dispersibility. When the temperature is lower than 0° C., the reaction temperature is too low, which significantly slows down the formation of the ZnO nanoparticles, and even cannot produce the ZnO nanoparticles, but only obtains the hydroxide intermediates. When the temperature is higher than 70° C., the formed nanoparticles have poor dispersibility and serious agglomeration, which affects the film formation of the doped ZnO colloid solution. In some embodiments, the reaction temperature is selected in the range of the room temperature to 50° C., and the reaction duration is selected from 30 min to 4 h to ensure the formation of the doped ZnO nanoparticles and control the particle sizes of the nanoparticles. When the reaction duration is less than 30 min, the reaction duration is too short that the formation of the doped ZnO nanoparticle is insufficient, and the crystallinity of the obtained nanoparticles is poor. When the reaction duration is longer than 4 h, the excessively long particle growth time causes that the generated nanoparticles are too large, and the particle sizes are not uniform. Thus, the film formation of the doped ZnO colloid solution is affected. In some embodiments, the reaction duration is selected as 1~2 h. The alkaline solution is selected from at least one of lithium hydroxide, sodium hydroxide, potassium hydroxide, tetramethylammonium hydroxide (TMAH), ammonia water, ethanolamine, or ethylenediamine.

Further, according to a ratio of a sum of an amount of a substance of the zinc ions and an amount of a substance of the divalent metal ions to an amount of a substance of OH— is 1:(1.5-2.5), the alkaline solution is added for reaction, which ensures the formation of the doped ZnO nanoparticles and reduces the generation of reaction by-products. When hydroxide root ions are too few, the metal salts are correspondingly significantly excessive, which causes that a large amount of metal salts is unable to generate the doped ZnO nanoparticles. In some embodiments, according to the ratio of the sum of the amount of the substance of the zinc ion and the amount of the substance of the divalent metal ion to the amount of the substance of $OH^-$ is 1:(1.7-2.9), the alkaline solution is added for the reaction.

Further, at S02, the divalent-metal-ion-doped ZnO nanoparticle solution can be added with a precipitant to remove the solvent to obtain the divalent-metal-ion-doped ZnO nanoparticles. In some embodiments, the volume ratio of the precipitant added to the divalent-metal-ion-doped ZnO nanoparticle solution is (2-6):1. That is, the precipitant is added to the divalent-metal-ion-doped ZnO nanoparticle solution after the reaction with a volume ratio of (2-6):1, then the ZnO nanoparticles doped with the divalent metal ions are obtained by centrifuging the above solution. The obtained ZnO nanoparticles doped with the divalent metal ions are re-solubilized in the first solvent, the washing process is repeated for several times to remove the reactants which are not involved in the reaction. The final obtained ZnO nanoparticles doped with the metal ions are dissolved in the second solvent, the divalent-metal-ion-doped ZnO colloid solution is obtained. The volume ratio of the precipitant to the divalent-metal-ion-doped ZnO nanoparticle solution is selected as (2-6):1 to ensure that the solubility of the doped ZnO nanoparticles cannot be destroyed by the excessive precipitant under sufficient precipitation of the doped ZnO nanoparticles. In some embodiments, the precipitant is selected in a volume ratio of the precipitant to the divalent-metal-ion-doped ZnO nanoparticles solution is selected as (3-5):1. The precipitant is selected from at least one of ethyl acetate, n-hexane, n-heptane, or acetone.

Further, at S03, the doping concentration of the divalent metal in the divalent-metal-ion-doped ZnO colloid solution is 2% to 30%. That is, at S01, a molar percentage of the amount of the substance of the doped metal ions of the divalent doping metal salt to the amount of the substance of the total metal ions is 2%-30%. The zinc salt and the divalent doping metal salt are dissolved in the first solvent (where the amount of the substance of the total metal ions refers to the sum of the amount of the substances of the doped metal ions and the amount of the substance of the zinc ions) to obtain the divalent-metal-ion-doped ZnO colloid solution. The doping concentration of the divalent metal is 2%-30%. The doping molar concentration of the divalent doped metal ions depends on the difference between the ion radius of the doped divalent-metal-ions and the ion radius of the zinc ions. The smaller the difference of the ion radiuses is, the higher the doping limit of the divalent metal ions in the ZnO material is, and the higher the molar concentration can be doped. Therefore, the doping molar concentration of the divalent metal ion may be determined according to the difference between the radius of the divalent metal ion and the radius of the zinc ion (As shown in TABLE.1). The doped divalent metal ions include the divalent metal ions that are easily oxidized to higher-valence states, such as $Fe^{2+}$, $Mn^{2+}$, $Cr^{2+}$, $Co^{2+}$, etc. In some embodiments, the doping molar concentration of $Fe^{2+}$ is 5-30%, the doping molar concentration of $Co^{2+}$ is 2-25%, the doping molar concentration of $Mn^{2+}$ is 2-25%, and the doping molar concentration of $Cr^{2+}$ is 2-20%. The doping molar concentration of the doped divalent metal ion cannot exceed the doping limit. However, the doping molar concentration of the doped divalent metal ion needs to reach a certain doping molar concentration to increase the doping limit of the high-valence metal ions in the ZnO after the oxidation treatment. Therefore, the conductivity of the ZnO can be further improved. In some embodiments, the doping molar concentration of $Fe^{2+}$ is 7-27%, the doping molar concentration of $Co^{2+}$ is 4-23%, the doping molar concentration of $Mn^{2+}$ is 4-23%, and the doping molar concentration of $Cr^{2+}$ is 4-18%. In some embodiments, the doping molar concentration of $Fe^{2+}$ is 10-25%, the doping molar concentration of $Co^{2+}$ is 8-20%, the doping molar concentration of $Mn^{2+}$ is 8-20%, and the doping molar concentration of $Cr^{2+}$ is 8-15%. In some embodiments, the doping molar concentration of $Fe^{2+}$ is 14-22%, the doping molar concentration of $Co^{2+}$ is 12-18%, the doping molar concentration of $Mn^{2+}$ is 12-18%, and the doping molar concentration of $Cr^{2+}$ is 10-14%. At optimal metal ion doping molar concentrations, the existence of sufficient amounts of the low-valence metal ions may reduce the lattice distortion caused by high-valence metal ions. The doping limit of high-valence metal ions in ZnO materials may be maximized. At the same time, the sufficient amount of the high-valence metal ions are doped into the ZnO crystal structure to maximize the conductivity of the ZnO material.

Further, a method for depositing the divalent-metal-ion-doped ZnO colloid solution on the substrate is described. The method includes but is not limited to one of spin-coating, scratch-coating, printing, spraying, roller coating, electrodeposition methods, etc. Then the oxidation treatment is performed to obtain the ZnO electron transport material.

Further, at S04, depositing the divalent-metal-ion-doped ZnO colloid solution on the substrate for the oxidation treatment includes the following processes. The divalent-metal-ion-doped ZnO colloid solution is deposited on the substrate. In the oxygen environment, the heating treatment is performed at the temperature of 100-400° C. for 0.5-12 h. The specific condition of the oxygen environment is that the oxygen used is industry grade oxygen with a purity above 99.5%. The conditions of the described oxidation treatment can be further optimized according to how easy the divalent doped metal ions can be oxidized in the oxygen (for example, in the oxygen environment at the same heating temperature, $Fe^{2+}$ and $Cr^{2+}$ are most easily oxidized, followed by $Mn^{2+}$, and most slowly is $Co^{2+}$). Therefore, in some embodiments, the heating treatment temperature of the $Fe^{2+}$ doped ZnO electron transport material is 100-300° C. for 30-6 h. The heating treatment temperature of the $Cr^{2+}$ doped ZnO electron transport material is 100-300° C. for 30-6 h. The heating treatment temperature of the $Mn^{2+}$ doped ZnO electron transport material is 200-400° C. for 1-8 h. The heating treatment temperature of the $Co^{2+}$ doped ZnO electron transport material is 200-400° C. for 4-12 h.

During the oxidation treatment, the selected oxidation treatment temperature needs to ensure the generation of the high-valent metal ions and to prevent the damage of the substrate. When the oxidation treatment temperature is too low, the transition process of the divalent-metal-ion-doped ions to the high-valent metal ions with the same metal element becomes very slow, and the oxidation treatment may even be impossible. However, when the oxidation treatment temperature is too high, the high temperature can cause the damage of the substrate of the electron transport material, and cause the oxidation treatment of the divalent-metal-ion-doped ions too fast and difficult to control.

The key of embodiments of the present disclosure is that after the oxidation treatment of the doped ZnO electron transport material, the sufficient amount of the divalent metal ions is preserved to increase the doping limit of the high valence metal ions in the ZnO material while the sufficient amount of the high valence doped metal ions can be generated and doped into the ZnO crystal structure. In this case, the processing time of the oxidation treatment becomes the key to adjust the doping ratio of the high and low valence ion of the same metal element in the ZnO electron transport materials. When the processing time of the oxidation treatment is too short, too few divalent doped metal ions are oxidized to the high-valence doped metal ions, which cannot improve the conductivity of the ZnO electron transport material. When the processing time of the oxidation treatment is too long, the excessive amount of the high-valence doped metal ions are generated, such that the remaining divalent doped metal ions is too few, which cannot increase the doping limit of high-valence metal ions in the ZnO. As a result, some of the generated high-valence metal ions are precipitated from the ZnO material in the form of the second phase, which adversely affects the conductivity of the ZnO electron transport material.

When the nano-ZnO electron transport material of the present disclosure is $Cr^{4+}$ and $Cr^{2+}$ co-doped ZnO, the molar ratio of $Cr^{4+}$ to $Cr^{2+}$ may be 20:1-1:2. In some embodiments, the molar ratio of $Cr^{4+}$ to $Cr^{2+}$ may be 10:1-1:2, 3:1-2:3, or 3:2-2:3.

When the nano-ZnO electron transport material of the present disclosure is $Mn^{4+}$ and $Mn^{2+}$ co-doped ZnO, the molar ratio of $Mn^{4+}$ to $Mn^{2+}$ may be 10:1-2:3. In some embodiments, the molar ratio of $Mn^{4+}$ to $Mn^{2+}$ may be 5:1-2:3, 2:1-1:1, or 3:2-1:1.

When the ZnO nanoelectron transport material of the present disclosure is $Co^{4+}$ and $Co^{2+}$ co-doped ZnO, the molar ratio of $Co^{4+}$ to $Co^{2+}$ may be 10:1-2:3. In some embodiments, the molar ratio of $Co^{4+}$ to $Co^{2+}$ may be 5:1-2:3, 2:1-1:1, or 3:2-1:1.

Embodiments of the present disclosure also provide a QLED. The QLED includes an anode, a cathode, and a QD light-emitting layer located between the anode and the cathode. An ETL is located between the cathode and the QD light-emitting layer. The ETL is comprised of the above electron transport material according to embodiments of the present disclosure.

Correspondingly, the QLED may be an inverted type QLED. The QLED also includes an ETL. A preparation method of the QLED includes the following processes.

A substrate is provided, and the substrate includes an anode.

The preparation method of the embodiments of the present disclosure is used to prepare the electron transport material to form the ETL.

The preparation method of the QLED uses partially easily oxidized divalent-metal-ion-doped ZnO material to form the electron transport material. The ETL with the same metal element ions in the high and low valence states co-doped ZnO is prepared by the oxidation treatment of the electron transport material. The preparation method significantly improves the solid solubility limit of the high-valent metal ions in the ZnO material, further optimizes the conductivity of the ZnO electron transport material, and overall improves the luminous efficiency and performance of the device.

In some embodiments, the preparation method of a QLED device includes the following processes.

At A, the doped ZnO colloid solution is deposited on a cathodic substrate, and the deposited layer on the cathodic substrate is oxidized to obtain a co-doped ZnO ETL of the same metal element ions in the high and low valence states of the present disclosure.

At B, a QD light-emitting layer is deposited on the ETL.

At C, a hole transport layer (HTL) is deposited on the QD light-emitting layer, and the anode is evaporated on the HTL to obtain the QLED.

In the present disclosure, the substrate material is a glass sheet, and the cathode is an indium tin oxide (ITO) substrate.

Further, the method for depositing the divalent-metal-ion-doped ZnO colloid solution on the substrate includes but is not limited to one of spin-coating, scratch-coating, printing, spraying, roller-coating, electrodeposition methods, etc. The doped ZnO ETL is prepared by one of the above methods. A thickness of the doped ZnO ETL is 10-100 nm. When the thickness of the ETL is less than 10 nm, the film layer is easily penetrated by the electrons and the carrier injection performance cannot be guaranteed. When the thickness of the ETL is more than 100 nm, the ETL may block the injection of electrons and affects the charge injection balance of the device.

In the preparation method of the QLED device, the QDs of the QD light-emitting layer may be one of three kinds of QDs of red, green or blue. The QDs may be at least one of CdS, CdSe, CdTe, ZnO, ZnS, ZnSe, ZnTe, GaAs, GaP, GaSb, HgS, HgSe, HgTe, InAs, InP, InSb, AlAs, AlP, CuInS, CuInSe, various core-shell structure QDs, or alloy structure QDs. The QDs may be any of the red, green, or blue QDs, or other yellow light. The QDs may be Cd-containing or Cd-free. The QD light-emitting layer material has characteristics, such as wide excitation spectrum and continuous distribution, and high emission spectrum stability, etc. The preparation of the QD light-emitting layer includes the following processes. The spin-coated ETL substrate is placed on a homogenizer. The prepared light-emitting solution with a certain concentration is spin-coated to form a film. The thickness of the light-emitting layer is controlled by adjusting the concentration of the solution, the spin-coating speed, and the spin-coating time. The thickness of the light-emitting layer is controlled to be 20~60 nm, and the light-emitting layer is dried at an appropriate temperature.

In the QLED device preparation method, the HTL can be made from conventional hole transport materials, which includes but not limited to poly[(9,9-dioctylfluorenyl-2,7-diyl)-co-(4,4'-(N-(4-sec-butylphenyl)diphenylamine)] (TFB), poly(9-vinyl carbazole) (PVK), poly[N,N'-bis(4-butylphenyl)-N,N'-bisphenylbenzidine] (Poly-TPD), tris(4-carbazoyl-9-ylphenyl)amine (TCTA), 4,4'-Bis(9-carbazolyl)-1,1'-biphenyl (CBP), or a mixture of any combination thereof. The hole transport material can also be other high-performance hole transport materials. The preparation of the HTL includes the following processes. The spin-coated ETL substrate is placed on the homogenizer. The prepared hole transport material is spin-coated to form a film. The thickness of the light-emitting layer is controlled by adjusting the concentration of the solution, the spin-coating speed, and the spin-coating time. The HTL is dried at an appropriate temperature.

The substrates with the deposited functional layers are then placed in an evaporation chamber and thermally evaporated with a layer of 15-30 nm metal of silver or aluminum through a mask. The evaporated metal of silver or aluminum serves as the anode. The evaporated metal may also be Ag nanowires or Cu nanowires, which have low resistance for the carrier to be smoothly injected.

Further, the obtained QLED is packaged. The packaging process may use a common machine for packaging or be manual packaging. In some embodiments, in a packaging process environment, both oxygen content and water content are below 0.1 ppm to ensure the stability of the device.

The present disclosure has been subjected to a number of experiments, and some experiment results are used as references to further describe the present disclosure in detail. The present disclosure is described in connection with specific embodiments below.

In some embodiments, the preparation of Fe ion doped ZnO colloid solution is described in detail as an example of the Fe ion doped ZnO electron transport material. The preparation of Fe ion doped ZnO electron transport material and the oxidation treatment are described in detail below.

First, zinc acetate with an appropriate amount and ferrous iron salt $FeSO_4$ with an appropriate amount are added to 50 ml methanol solvent to form a mixture salt solution with a total concentration of 0.1 mol/L, where the Fe' doping molar concentration is 20%. At the same time, potassium hydroxide (KOH) powder with an appropriate amount is dissolved in another 50 ml of methanol solvent to form an alkaline solution of 0.3 mol/L. The mixture salt solution is then heated to 50° C. and the KOH solution is added drop by drop in the mixture salt solution until the molar ratio of OH— root ions to metal ions is 1.7:1. After the dripping of the KOH solution, the mixture solution is stirred at 50° C. for 2 h to obtain an uniform transparent solution. Subsequently, an ethyl acetate solvent with a volume ratio of 3:1 is added to the uniform transparent solution, which results in a large amount of white precipitate in the transparent solution. The turbid solution is centrifuged at 7000 rpm. The white precipitate is then dissolved again in methanol solvent. This washing process is repeated for four times. The finally obtained white precipitate is dissolved in ethanol solvent of an appropriate amount to obtain a divalent Fe ions-doped ZnO colloid solution with a concentration of 30 mg/ml.

The divalent Fe ions-doped ZnO colloid solution with a concentration of 30 mg/ml is then deposited on the ITO substrate by using spin-coating method. The spin-coating speed is 3000 rpm and the spin-coating time is 30 s, which control the thickness of the doped ZnO electron transport material at around 50 nm.

Finally, the substrate deposited with the divalent Fe ions-doped ZnO electron transport material is placed in a muffle furnace. Under an oxygen atmosphere with a purity of 99.5%, the doped ZnO electron transport material is heated to 200° C. and kept at this temperature for 2 h to produce a high and low valence Fe ion co-doped ZnO electron transport material.

In some embodiments, the preparation of Cr ion doped ZnO colloid solution is described in detail as an example of the Cr ion doped ZnO electron transport material. The preparation of Cr ion doped ZnO electron transport material and the oxidation treatment are described in detail below.

First, zinc nitrate of an appropriate amount and divalent Cr salt $CrCl_2$ of an appropriate amount are added to 50 ml ethanol solvent to form a mixture salt solution with a total concentration of 0.1 mol/L, where the $Cr^{2+}$ doping molar concentration is 15%. At the same time, lithium hydroxide (LiOH) powder of an appropriate amount is dissolved in another 50 ml of ethanol solvent to form an alkaline solution of 0.2 mol/L. The mixture salt solution is then heated to 40° C. and the LiOH solution is added drop by drop in the mixture salt solution until the molar ratio of OH— root ions to metal ions is 1.9:1. After the dripping of LiOH solution, the mixed solution is stirred at 30° C. for 1 h to obtain an uniform transparent solution. Subsequently, an n-heptane solvent with a volume ratio of 4:1 is added to the uniform transparent solution, which results in a large amount of white precipitate in the transparent solution. The turbid solution is centrifuged at 7000 rpm. The white precipitate is then dissolved again in the ethanol solvent. This washing process is repeated for four times. The finally obtained white precipitate is dissolved in the ethanol solvent of an appropriate amount to obtain the divalent Cr ions-doped ZnO colloid solution with a concentration of 30 mg/ml.

The divalent Cr ions-doped ZnO colloid solution with a concentration of 30 mg/ml is then deposited on the ITO substrate by the spin-coating method. The spin-coating speed is 1500 rpm and the spin-coating time is 30 s, which control the thickness of the doped ZnO electron transport material at around 80 nm.

Finally, the substrate deposited with the divalent Cr ions-doped ZnO electron transport material is placed in a muffle furnace. Under an oxygen atmosphere with a purity of 99.5%, the doped ZnO electron transport material is heated to 200° C. and kept at this temperature for 4 h to produce the high and low valence Fe ion co-doped ZnO electron transport material.

In some embodiments, the preparation of Mn ion doped ZnO colloid solution is described in detail as an example of the Mn ion doped ZnO electron transport material. The preparation of the Mn ion doped ZnO electron transport material and the oxidation treatment are described in detail below.

First, zinc sulfate of an appropriate amount and divalent manganese salt $Mn(CH_3COO)_2$ of an appropriate amount are added to 50 ml DMSO solvent to form a mixture salt solution with a total concentration of 0.1 mol/L, where the $Mn^{2+}$ doping molar concentration is 15%. At the same time, TMAH powder of an appropriate amount is dissolved in another 30 ml of ethanol solvent to form an alkaline solution of 0.3 mol/L. The mixture salt solution is kept at room temperature, and the TMAH solution is added drop by drop in the mixture salt solution until the molar ratio of OH— root ions to metal ions is 1.5:1. After the dripping of TMAH solution, the mixture solution is stirred at room temperature for 2 h to obtain an uniform transparent solution. Subsequently, an ethyl acetate solvent with a volume ratio of 4:1 is added to the uniform transparent solution, which results in a large amount of white precipitate in the transparent solution. The turbid solution is centrifuged at 7000 rpm. The white precipitate is then dissolved again in the ethanol solvent. This washing process is repeated for four times. The finally obtained white precipitate is dissolved in the ethanol solvent of an appropriate amount to obtain the divalent Mn ions-doped ZnO colloid solution with a concentration of 30 mg/ml.

The divalent Mn ions-doped ZnO colloid solution with the concentration of 30 mg/ml is then deposited on the ITO substrate by using the spin-coating method. The spin-coating speed is 4500 rpm and the spin-coating time is 30 s, which control the thickness of the doped ZnO electron transport material at around 20 nm.

Finally, the substrate deposited with divalent Mn ions-doped ZnO electron transport material is placed in a muffle furnace. Under an oxygen atmosphere with a purity of 99.5%, the doped ZnO electron transport material is heated to 300° C. and kept at this temperature for 6 h to produce the high and low valence Mn ion co-doped ZnO electron transport material.

In some embodiments, the preparation of Co ion doped ZnO colloid solution is described in detail as an example of Co ion doped ZnO electron transport material. The preparation of Co ion doped ZnO electron transport material and the oxidation treatment are described in detail below.

First, zinc chloride of an appropriate amount and the divalent Co salt $Co(NO_3)_2$ of an appropriate amount are added to 50 ml methanol solvent to form a mixture salt solution with a total concentration of 0.1 mol/L, where the $Co^{2+}$ doping molar concentration is 15%. At the same time, sodium hydroxide (NaOH) powder of an appropriate amount is dissolved in another 30 ml of ethanol solvent to form an alkaline solution of 0.3 mol/L. The mixture salt solution is heated to 50° C., and the NaOH solution is added drop by drop in the mixture salt solution until the molar ratio of OH— root ions to metal ions is 1.8:1. After the dripping of NaOH solution, the mixture solution is stirred at 50° C. for 1 h to obtain an uniform transparent solution. Subsequently, an n-hexane solvent with a volume ratio of 5:1 is added to the uniform transparent solution, which results in a large amount of white precipitate in the transparent solution. The turbid solution is centrifuged at 7000 rpm. The white precipitate is then dissolved again in the methanol solvent. This washing process is repeated for four times. The finally obtained white precipitate is dissolved in the ethanol solvent of an appropriate amount to obtain the divalent Co ions-doped ZnO colloid solution with a concentration of 30 mg/ml.

The divalent Co ions-doped ZnO colloid solution with the concentration of 30 mg/ml is then deposited on the ITO substrate by using the spin-coating method. The spin-coating speed is 3000 rpm and the spin-coating time is 30 s, which control the thickness of the doped ZnO electron transport material at around 50 nm.

Finally, the substrate deposited with divalent Co ions-doped ZnO electron transport material is placed in a muffle furnace. Under an oxygen atmosphere with a purity of 99.5%, the doped ZnO electron transport material is heated to 400° C. and kept at this temperature for 8 h to produce the high and low valence Co ion co-doped ZnO electron transport material.

In some embodiments, the preparation method of a QLED device includes the following processes.

Step A, a doped ZnO ETL is spin-coated on an ITO substrate, and the oxidation treatment is performed on the coated substrate.

Step B, a QD light-emitting layer is deposited on the ETL.

Step C, a hole transport layer (HTL) is deposited on the QD light-emitting layer, and an anode is evaporated on the HTL to obtain the QLED.

In some embodiments, the QLED device has an inverted configuration. FIG. 1 illustrates a schematic structural diagram of a quantum dot light-emitting diode (QLED) according to some embodiments of the present disclosure. The QLED device from the bottom to the top includes a substrate 1, a cathode 2, an ETL 3, a QD light-emitting layer 4, an HTL 5, and an anode 6. The material of the substrate 1 is a glass sheet. The material of the cathode 2 is an ITO substrate. The material of the ETL 3 is a high and low valence of the same metal ions co-doped ZnO. The material of the HTL 5 is TFB. The material of the anode 6 is Al.

The embodiments of the present disclosure described above are not intended to limit the scope of the present disclosure. Any modifications, equivalent replacements, improvements, etc. made within the spirit and principles of the present disclosure shall be within the scope of the present disclosure.

What is claimed is:

1. An electron transport material comprising zinc oxide (ZnO) doped with metal ions, wherein:
   the metal ions are two or three metal ions of different valences of a same metal element; and
   a lowest valence state of the metal ions is positive divalent.

2. The electron transport material of claim 1, wherein:
   the electron transport material includes $Fe^{3+}$ and $Fe^{2+}$ co-doped ZnO; or
   the electron transport material includes $Mn^{4+}$ and $Mn^{2+}$ co-doped ZnO; or
   the electron transport material includes $Co^{4+}$ and $Co^{2+}$ co-doped ZnO; or
   the electron transport material includes $Cr^{4+}$ and $Cr^{2+}$ co-doped ZnO.

3. The electron transport material of claim 2, wherein:
   the electron transfer material includes the $Fe^{3+}$ and $Fe^{2+}$ co-doped ZnO, and a molar ratio of $Fe^{3+}$ and $Fe^{2+}$ is 20:1 to 1:1; or
   the electron transfer material includes the $Mn^{4+}$ and $Mn^{2+}$ co-doped ZnO, and a molar ratio of $Mn^{4+}$ and $Mn^{2+}$ is 10:1 to 2:3; or
   the electron transfer material includes the $Co^{4+}$ and $Co^{2+}$ co-doped ZnO, and a molar ratio of $Co^{4+}$ and $Co^{2+}$ is 10:1 to 2:3; or
   the electron transfer material includes the $Cr^{4+}$ and $Cr^{2+}$ co-doped ZnO, and a molar ratio of $Cr^{4+}$ and $Cr^{2+}$ is 20:1 to 1:2.

4. The electron transport material of claim 3, wherein:
   the electron transfer material includes the $Fe^{3+}$ and $Fe^{2+}$ co-doped ZnO, and a molar ratio of $Fe^{3+}$ and $Fe^{2+}$ is 9:5 to 3:2; or
   the electron transfer material includes the $Mn^{4+}$ and $Mn^{2+}$ co-doped ZnO, and a molar ratio of $Mn^{4+}$ and $Mn^{2+}$ is 3:2 to 1:1; or
   the electron transfer material includes the $Co^{4+}$ and $Co^{2+}$ co-doped ZnO, and a molar ratio of $Co^{4+}$ and $Co^{2+}$ is 3:2 to 1:1; or
   the electron transfer material includes the $Cr^{4+}$ and $Cr^{2+}$ co-doped ZnO, and a molar ratio of $Cr^{4+}$ and $Cr^{2+}$ is 3:2 to 2:3.

5. The electron transport material of claim 2, wherein:
   the electron transport material includes $Mn^{4+}$, $Mn^{2+}$, and $Mn^{3+}$ co-doped ZnO; or
   the electron transport material includes $Co^{4+}$, $Co^{2+}$, and $Co^{3+}$ co-doped ZnO; or
   the electron transport material includes $Cr^{4+}$, $Cr^{2+}$, and $Cr^{3+}$ co-doped ZnO.

6. A preparation method of an electron transport material comprising:
   providing a zinc salt and a divalent doping metal salt;
   dissolving the zinc salt and the divalent doping metal salt in a first solvent to obtain a divalent-metal-ion-doped ZnO nanoparticle in an alkali condition;
   dispersing the divalent-metal-ion-doped ZnO nanoparticles in a second solvent to obtain a divalent-metal-ion-doped ZnO colloid solution;
   depositing the divalent-metal-ion-doped ZnO colloid solution on a substrate; and
   performing an oxidation treatment to obtain the electron transport material doped with metal ions, wherein the metal ions are two or three metal ions of different valences of a same metal element, and a lowest valence state of the metal ions is positive divalent.

7. The method of claim 6, wherein:
   the zinc salt is selected from at least one of zinc acetate ($Zn(CH_3COO)_2$) and hydrate thereof, zinc nitrate ($Zn(NO_3)_2$) and hydrate thereof, zinc sulfate ($ZnSO_4$) and hydrate thereof, or zinc chloride ($ZnCl_2$) and hydrate thereof; and
   the divalent doping metal salt is selected from at least one of a divalent iron salt, a divalent manganese salt, a divalent chromium salt, or a divalent cobalt salt; and
   the first solvent and the second solvent are individually selected from at least one of water, methanol, ethanol, propanol, butanol, ethylene glycol, ethylene glycol monomethyl ether, or dimethyl sulfoxide (DMSO).

8. The method of claim 6, further comprising dissolving the zinc salt and the divalent doping metal salt in the first solvent, according to a molar percentage of 2%-30% indicating a molar amount of a substance of the doped metal ions in the divalent doping metal salt divided by a molar amount of a substance of total metal ions, wherein the molar amount of the substance of the total metal ions refers to a sum of the molar amount of the substance of the doped metal ions and the molar amount of the substance of zinc ions.

9. The method of claim 8, further comprising:
   when the divalent doping metal salt is a divalent Fe salt, dissolving the zinc salt and the divalent Fe salt in the first solvent according to a molar percentage of 5%-30% indicating a molar amount of a substance of $Fe^{2+}$ in the divalent Fe salt divided by the molar amount of the substance of the total metal ions; or
   when the divalent doping metal salt is a divalent Mn salt, dissolving the zinc salt and the divalent Mn salt in the first solvent according to a molar percentage of 2%-25% indicating a molar amount of a substance of $Mn^{2+}$ in the divalent Mn salt divided by the molar amount of the substance of the total metal ions; or
   when the divalent doping metal salt is a divalent Co salt, dissolving the zinc salt and the divalent Co salt in the first solvent according to a molar percentage of 2%-25% indicating a molar amount of a substance of $Co^{2+}$ in the divalent Co salt divided by the molar amount of the substance of the total metal ions; or when the divalent doping metal salt is a divalent Cr salt, dissolving the zinc salt and the divalent Cr salt in the first solvent according to a molar percentage of 2%-25% indicating a molar amount of a substance of $Cr^{2+}$ in the divalent Cr salt divided by the molar amount of the substance of the total metal ions.

10. The method of claim 9, further comprising:

when the divalent doping metal salt is a divalent Fe salt, dissolving the zinc salt and the divalent Fe salt in the first solvent according to a molar percentage of 14%-22% indicating a molar amount of a substance of Fe2+ in the divalent Fe salt divided by the molar amount of the substance of the total metal ions; or when the divalent doping metal salt is a divalent Mn salt, dissolving the zinc salt and the divalent Mn salt in the first solvent according to a molar percentage of 12%-18% indicating a molar amount of a substance of Mn2+ in the divalent Mn salt divided by the molar amount of the substance of the total metal ions; or when the divalent doping metal salt is a divalent Co salt, dissolving the zinc salt and the divalent Co salt in the first solvent according to a molar percentage of 12%-18% indicating a molar amount of a substance of Co2+ in the divalent Co salt divided by the molar amount of the substance of the total metal ions; or when the divalent doping metal salt is a divalent Cr salt, dissolving the zinc salt and the divalent Cr salt in the first solvent according to a molar percentage of 10%-14% indicating a molar amount of a substance of Cr2+ in the divalent Cr salt divided by the molar amount of the substance of the total metal ions.

11. The method of claim 6, further comprising:

according to a molar ratio of 1:(1.5-2.5) that is a sum of an molar amount of a substance of zinc ions and an molar amount of a substance of divalent metal ions divided by an molar amount of a substance of $OH^-$, dissolving the zinc slat and the divalent doping metal salt in the first solvent to obtain a ZnO nanoparticle solution doped with the divalent metal ions in the alkali condition.

12. The method of claim 6, wherein depositing the divalent-metal-ion-doped ZnO colloid solution on the substrate for oxidation treatment includes:

depositing the divalent-metal-ion-doped ZnO colloid solution on the substrate; and performing a heating treatment to the substrate in an oxygen environment.

13. The method of claim 12, wherein:

when the divalent doping metal salt is a divalent Fe salt, a heating treatment temperature is 100-300° C., and heating treatment time is 0.5-6 h; or when the divalent doping metal salt is a divalent Mn salt, the heating treatment temperature is 200-400° C., and the heating treatment time is 1-8 h; or when the divalent doping metal salt is a divalent Co salt, the heating treatment temperature is 300-400° C., and the heating treatment time is 4-12 h; or when the divalent doping metal salt is a divalent Cr salt, the heating treatment temperature is 100-300° C., and the heating treatment time is 0.5-6 h.

14. A quantum dot light-emitting diode (QLED) comprising:

an anode;
a cathode; and a quantum dot light-emitting layer, arranged between the anode and the cathode;

an electron transport layer, arranged between the cathode and the quantum dot light-emitting layer, including:
zinc oxide (ZnO) doped with metal ions, wherein:
the metal ions are two or three metal ions of different valences of a same metal element; and
a lowest valence state of the metal ions is positive divalent.

15. The QLED of claim 14, wherein:

the electron transport material includes $Fe^{3+}$ and $Fe^{2+}$ co-doped ZnO; or the electron transport material includes $Mn^{4+}$ and $Mn^{2+}$ co-doped ZnO; or the electron transport material includes $Co^{4+}$ and $Co^{2+}$ co-doped ZnO; or the electron transport material includes $Cr^{4+}$ and $Cr^{2+}$ co-doped ZnO.

16. The QLED of claim 15, wherein:

the electron transfer material includes the $Fe^{3+}$ and $Fe^{2+}$ co-doped ZnO, and a molar ratio of $Fe^{3+}$ and $Fe^{2+}$ is 20:1 to 1:1; or the electron transfer material includes the $Mn^{4+}$ and $Mn^{2+}$ co-doped ZnO, and a molar ratio of $Mn^{4+}$ and $Mn^{2+}$ is 10:1 to 2:3; or the electron transfer material includes the $Co^{4+}$ and $Co^{2+}$ co-doped ZnO, and a molar ratio of $Co^{4+}$ and $Co^{2+}$ is 10:1 to 2:3; or the electron transfer material includes the $Cr^{4+}$ and $Cr^{2+}$ co-doped ZnO, and a molar ratio of $Cr^{4+}$ and $Cr^{2+}$ is 20:1 to 1:2.

17. The QLED of claim 15, wherein:

the electron transport material includes $Mn^{4+}$, $Mn^{2+}$, and $Mn^{3+}$ co-doped ZnO; or the electron transport material includes $Co^{4+}$, $Co^{2+}$, and $Co^{3+}$ co-doped ZnO; or the electron transport material includes $Cr^{4+}$, $Cr^{2+}$, and $Cr^{3+}$ co-doped ZnO.

18. A preparation method of a quantum dot light-emitting diode (QLED) comprising:

providing a substrate, wherein:
the substrate is arranged with a cathode;
the QLED is an inverted QLED;
the QLED includes an electron transport layer; and
the electron transport layer is prepared by:
providing a zinc salt and a divalent doping metal salt;
dissolving the zinc salt and the divalent doping metal salt in a first solvent to obtain a divalent-metal-ion-doped ZnO nanoparticle in an alkali condition;
dispersing the divalent-metal-ion-doped ZnO nanoparticles in a second solvent to obtain a divalent-metal-ion-doped ZnO colloid solution;
depositing the divalent-metal-ion-doped ZnO colloid solution on a substrate; and
performing an oxidation treatment to obtain the electron transport material doped with metal ions, wherein the metal ions are two or three metal ions of different valences of a same metal element, and a lowest valence state of the metal ions is positive divalent.

19. The preparation method of claim 18, further comprising dissolving the zinc salt and the divalent doping metal salt in the first solvent, according to a molar percentage of 2%-30% indicating a molar amount of a substance of the doped metal ions in the divalent doping metal salt divided by a molar amount of a substance of total metal ions, wherein the molar amount of the substance of the total metal ions refers to a sum of the molar amount of the substance of the doped metal ions and the molar amount of the substance of zinc ions.

20. The preparation method of claim 18, wherein depositing the divalent-metal-ion-doped ZnO colloid solution on the substrate for oxidation treatment includes:
    depositing the divalent-metal-ion-doped ZnO colloid solution on the substrate; and
    performing a heating treatment to the substrate in an oxygen environment.

* * * * *